US012783782B2

(12) United States Patent
Thibaut et al.

(10) Patent No.: US 12,783,782 B2
(45) Date of Patent: Nov. 3, 2026

(54) UNIQUE IDENTIFIER CREATION AND MANAGEMENT FOR ELABORATED PLATFORM

(71) Applicant: ARTERIS, INC., Campbell, CA (US)

(72) Inventors: Vincent Thibaut, Jacou (FR); Guillaume Dufour, Ermont (FR); Gregoire Avot, Chaville (FR); Isabelle Pesquie Geday, Paris (FR)

(73) Assignee: ARTERIS, INC., Campbell, CA (US)

( * ) Notice: Subject to any disclaimer, the term of this patent is extended or adjusted under 35 U.S.C. 154(b) by 1065 days.

(21) Appl. No.: 17/955,487

(22) Filed: Sep. 28, 2022

(65) Prior Publication Data

US 2023/0100758 A1 Mar. 30, 2023

Related U.S. Application Data

(60) Provisional application No. 63/249,054, filed on Sep. 28, 2021.

(51) Int. Cl.
*G06F 30/30* (2020.01)
*G06F 30/398* (2020.01)

(52) U.S. Cl.
CPC .................................. *G06F 30/398* (2020.01)

(58) Field of Classification Search
USPC .......................................... 716/110, 111, 112
See application file for complete search history.

(56) References Cited

U.S. PATENT DOCUMENTS

| | | | | |
|---|---|---|---|---|
| 9,531,535 B2 * | 12/2016 | Ma | ........................ | H04L 9/0897 |
| 2017/0140165 A1 * | 5/2017 | Kaplan | ................. | H04L 9/3213 |
| 2019/0220635 A1 * | 7/2019 | Yeh | .................... | G06K 19/0702 |
| 2019/0286805 A1 * | 9/2019 | Law | ........................ | G06F 21/34 |

FOREIGN PATENT DOCUMENTS

JP 2004519874 A * 7/2004 ........... G06Q 20/403

* cited by examiner

*Primary Examiner* — Brian Ngo
(74) *Attorney, Agent, or Firm* — Dana Legal Services; Jubin Dana

(57) ABSTRACT

Systems and methods are disclosed to track each instance in an elaborated model of an integrated circuit system. There is a unique identification for each instance. Each unique identification includes a unique key and a handle based on one or more properties of the corresponding instance.

10 Claims, 6 Drawing Sheets

UNIQUE IDENTIFIER CREATION AND MANAGEMENT FOR ELABORATED PLATFORM

CROSS REFERENCE TO RELATED APPLICATION

This application claims the priority benefit of U.S. Provisional Application Ser. No. 63/249,054 that was filed on Sep. 28, 2021 and titled UNIQUE IDENTIFIER FOR ELABORATE PLATFORM by Vincent THIBAUT et al., the entire disclosure of which is incorporated herein by reference.

TECHNICAL FIELD

The present technology is in the field of computer system design and, more specifically, related to tracking changes while designing an integrated circuit (IC).

BACKGROUND

When a system designer is creating a system-on-chip (SoC) or other modern integrated circuit, the designer follows a process that typically involves connecting multiple components (e.g., processor core, memory, etc.). The process further involves instantiating the components to create an elaborated model of the integrated circuit (IC) system.

A challenging aspect of IC system design is tracking modifications and managing system rules. For example, a network-on-chip (NoC) may require a network controller to be at the top level of the model. A system designer may initially create a core that has the network controller at the top level and an elaborated model with an instantiation (instance) of the core. The design is later modified such that the network controller is no longer at the top level, and has been moved to the top SoC level. This modification can present a problem if it violates a system rule. The violation might not be detected until a much later phase of IC design. Therefore, what is needed are systems and methods that track each instantiation of a component in an IC system

SUMMARY

In accordance with various embodiments and aspects herein, systems and methods are disclosed to track each instantiation of a component in an integrated circuit (IC) system. According to various aspects and embodiments herein, an elaborated platform or model of the IC system is created. A unique identification (UID) for each instance of the model is created. The UID of each instance is stored in memory. The UID includes a unique key, and a handle that is based on one or more properties of the instance.

According to various aspects and embodiments of the invention, if the elaborated model is modified, a current handle for each instance in the modified model is created, and reconciliation between the current handle and the handle in an existing UID is performed to determine whether the instance in the modified model is unchanged.

BRIEF DESCRIPTION OF THE DRAWINGS

In order to understand the invention more fully, reference is made to the accompanying drawings. The invention is described in accordance with the aspects and embodiments in the following description with reference to the drawings or figures (FIG.), in which like numbers represent the same or similar elements. Understanding that these drawings are not to be considered limitations in the scope of the invention, the presently described aspects and embodiments and the presently understood best mode of the invention are described with additional detail through use of the accompanying drawings.

DETAILED DESCRIPTION

Figure 1:
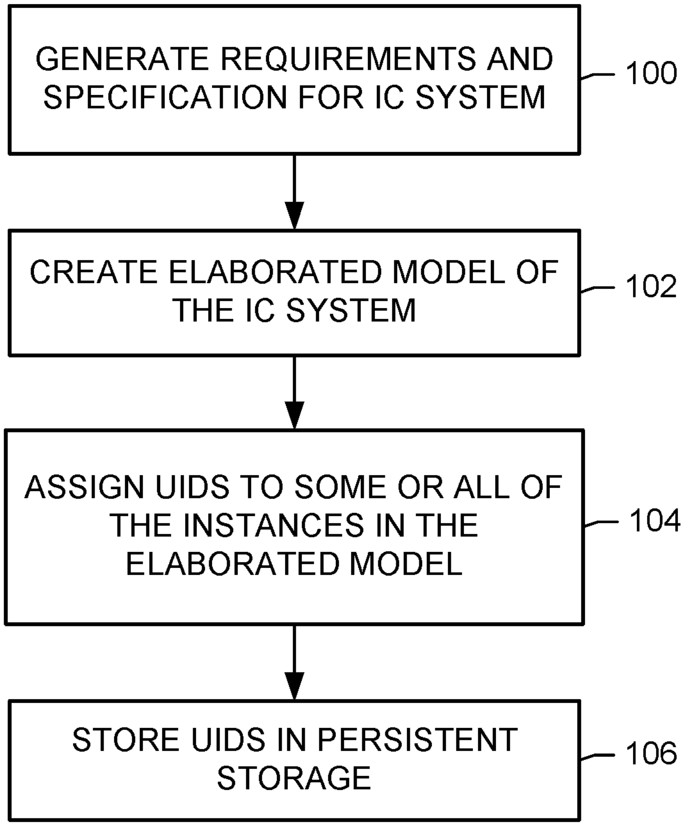
FIG. 1 shows a process for designing an integrated circuit (IC) system, which includes generating an elaborated model and creating a UID for each instance within the elaborated model in accordance with various aspects and embodiments herein.

The following describes various examples of the present technology that illustrate various aspects and embodiments of the invention. Generally, examples can use the described aspects in any combination. All statements herein reciting principles, aspects, and embodiments as well as specific examples thereof, are intended to encompass both structural and functional equivalents thereof. The examples provided are intended as non-limiting examples. Additionally, it is intended that such equivalents include both currently known equivalents and equivalents developed in the future, i.e., any elements developed that perform the same function, regardless of structure.

It is noted that, as used herein, the singular forms "a," "an" and "the" include plural referents unless the context clearly dictates otherwise. Reference throughout this specification to "one embodiment," "an embodiment," "certain embodiment," "various embodiments," or similar language means that a particular aspect, feature, structure, or characteristic described in connection with the embodiment is included in at least one embodiment of the invention.

Thus, appearances of the phrases "in one embodiment," "in at least one embodiment," "in an embodiment," "in certain embodiments," and similar language throughout this specification may, but do not necessarily, all refer to the same embodiment or similar embodiments. Furthermore, aspects and embodiments of the invention described herein are merely exemplary, and should not be construed as limiting of the scope or spirit of the invention as appreciated by those of ordinary skill in the art. The disclosed invention is effectively made or used in any embodiment that includes any novel aspect described herein. All statements herein reciting principles, aspects, and embodiments of the invention are intended to encompass both structural and functional equivalents thereof. It is intended that such equivalents include both currently known equivalents and equivalents developed in the future. Furthermore, to the extent that the terms “including”, “includes”, “having”, “has”, “with”, or variants thereof are used in either the detailed description and the claims, such terms are intended to be inclusive in a similar manner to the term “comprising.”

The terms “source,” “master,” and “initiator” refer to similar intellectual property (IP) modules/blocks or units; these terms are used interchangeably within the scope and embodiments of the invention. As used herein, the terms “sink,” “slave,” and “target” refer to similar IP modules or units and the terms are used interchangeably within the scope and embodiments of the invention. As used herein, a transaction may be a request transaction or a response transaction. Examples of request transactions include write request and read request.

Various references are made herein to integrated circuits (ICs) and the designs of ICs. One example of an integrated circuit (IC) is a multiprocessor system that is implemented in systems-on-chip (SoCs) that communicates through networks-on-chip (NoCs). The SoCs include instances of initiator intellectual properties (IPs) and target IPs. Transactions are sent from an initiator to one or more targets using industry-standard protocols. The initiator, connected to the NoC, sends a request transaction to a target or targets, using an address to select the target or targets. The NoC decodes the address and transports the request from the initiator to the target. The target handles the transaction and sends a response transaction, which is transported back by the NoC to the initiator. As such, the SoC and NoC include complexity and configurability, especially in situation when the NoC is configurable.

Reference is made to FIG. 1, which shows a process for designing an IC system. At step 100, requirements for the IC system are generated. The requirements may be dictated by marketing, sales, customer intent, etc.

Also at step 100, a system architect generates a specification that relates to the requirements. The specification provides a chip definition, technology, domains and layout for the IC system.

At step 102, an elaborated model of the IC system is created. Intellectual property (IP) blocks are selected from the architect’s library, configurable components are assembled from the IP blocks, and the selected IP is instantiated to produce an elaborated platform or elaborated model. The elaborated model may be characterized as the projection of the system level design on a specific configuration. The elaborated model contains instantiations or instances components.

The IP may be described in one or more IEEE 1685 standard file. The IEEE 1685 standard describes an XML schema for meta-data documenting IP used in the development, implementation, and verification of electronic systems. Standardized meta-data forms include components, systems, bus interfaces and connections, abstractions of those buses, and details of the components including address maps, register and field descriptions.

The IEEE 1685 standard provides for component-level identification. However, there is not necessarily a 1-to-1 mapping between components and instances. For example, several individual signals inside modules are connected hierarchically to form a network. This network has an existence only in the elaborated model. It is the result of signals, ports, assignments, etc. It may also be the result of some resolution rules.

While the IEEE 1685 standard provides for component-level identification, it does not provide for instance-level identification. In any event, the standard does not provide for the identification of multiple instances of the same component.

At step 104, instance-level identification is performed by assigning unique identifications (UIDs) to some or all of the instances in the elaborated model. An instance may be assigned a UID immediately after that instance has been created. According to one or more aspects and embodiments herein, the UID is based on a unique key and a handle based on one or more properties of the instance (e.g., number of memory cells in a memory IP).

At step 106, the UIDs are stored in memory such as persistent storage. According to one or more aspects and embodiments herein, the persistent storage and associated data stored therein may include one or more files, one or more databases, a remote file storage (e.g., cloud data storage), hard drive, memory card, structured file storage, digital ledger, blockchain, any other persistent storage device, and any combination thereof. According to one or more aspects and embodiments herein, the elaborated model and the UIDs are stored in persistent storage. The persistent storage allows the UIDs to be maintained between design tool invocations.

Figure 3:
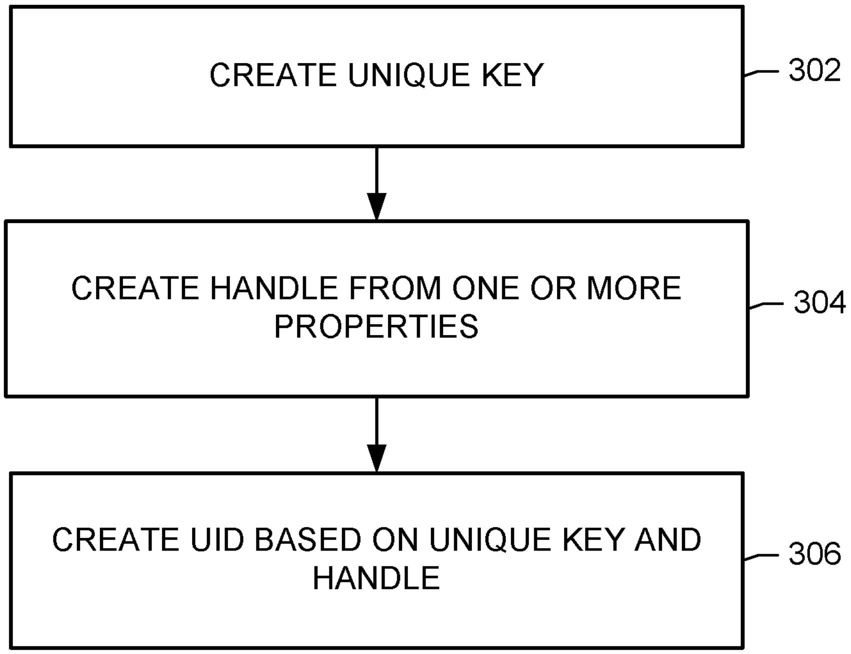
FIG. 3 shows a process for creating a unique identification for an instance in accordance with various aspects and embodiments herein.

Referring now to FIG. 3, a process is shown for creating a UID for an instance in accordance with the various aspects and embodiments herein. At step 302, a unique key is created. The unique key is immutable. The goal of the unique key is to maintain a unique value for all the different mutations of the UID during the evolution of the IC system design. The unique key may be generated by making persistent a unique key generator state, using external sources of unique values (e.g., a user, IP vendor, blockchain, etc.), etc.

At step 304, a handle is created. The handle is created from of one or more properties of the instance. According to one or more aspects and embodiments herein, a handle includes a reference to an instance. The handle will change when the instance is modified, but the key stays the same. Creation of the one or more handles is discussed in further detail in relation to FIG. 5.

At step 306, a UID is created from the unique key and the handle. According to one or more aspects and embodiments herein, the UID is created as a combination of a key and one or more handles. Additional data to be included in the UID may be specified.

Figure 4:
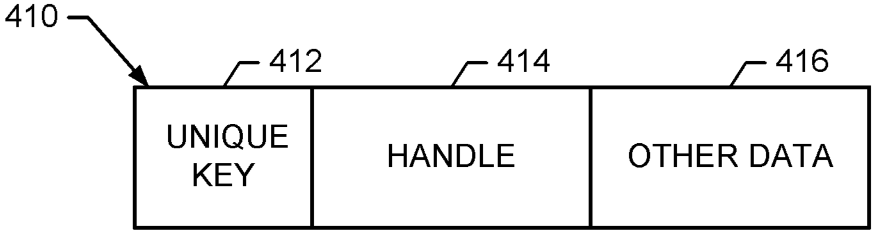
FIG. 4 is an illustration of a unique identification in accordance with the various aspects and embodiments herein.

Reference is made to FIG. 4, which illustrates a UID 410. The UID 410 may be characterized as a dynamic data structure that has fields for the unique key 412, the handle 414, and any other user data 416.

During the design of the IC system, the elaborated model will be modified. Modifications may include adding components, adding instances, removing components, removing instances, changing the hierarchy of instances, changing connectivity between elements, changing parameters of instances, and so on. For instance, a modification at the system level will immediately modify the elaborated model.

Figure 2:
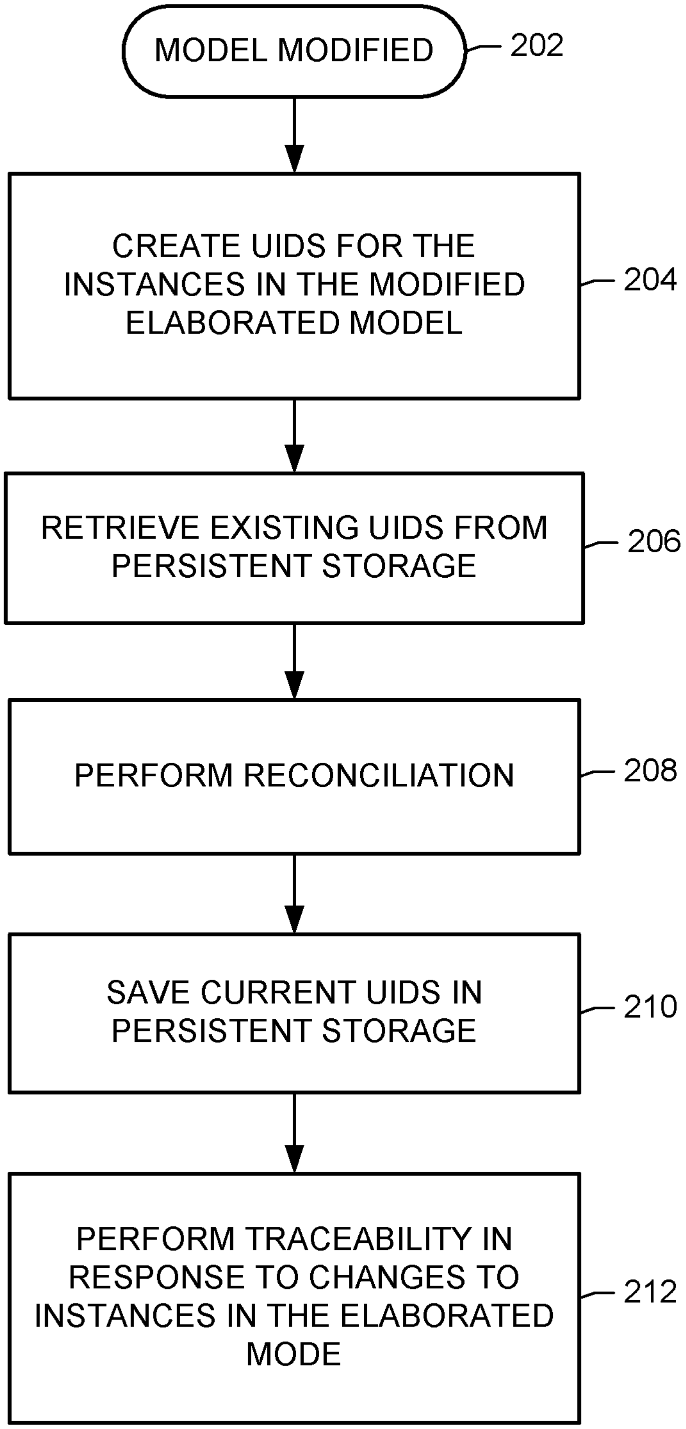
FIG. 2 shows a process for modification of the elaborated model and UID management in accordance with various aspects and embodiments herein.

Reference is now made to FIG. 2, which illustrates UID management after the model is modified (step 202). At step 204, UIDs are created for the instances in the modified elaborated model. This step may be the same or similar to step 104. The UIDs created at this step will be referred to as “current” UIDs.

At step 206, “existing” UIDs are retrieved from persistent storage. These UIDs correspond to the elaborated model before it was modified at step 202.

At step 208, for each instance in the elaborated model, reconciliation is performed to maintain and update each UID In persistent storage. Reconciliation identifies that an elaborated model instance is the same when the handle of the current UID is the same as the handle in the existing UID. When there is a change between the handles in the existing UID and the current UID, the current UID is updated with the change. According to one or more aspects and embodiments herein, when a change is detected and change history is maintained, a new handle is added to the handle list in the UID.

According to one or more aspects and embodiments herein, a filter function may be used to examine the handles to determine whether UIDs have been updated. The filtering saves computing time and storage space.

At step 210, the current UIDs are saved into persistent storage. According to one or more aspects and embodiments herein, when a change is detected and only the last version is preserved, the handle of the UID is overwritten.

The UIDs enable instances in the elaborated model to be tracked. Not only that, but the UIDs enable the tracking to be performed in real time after modifications have been made.

At step 212, traceability is performed upon changes to instances in the elaborated model. Complex design rules may be run against an elaborated model. In some embodiments, traceability may be used for obtaining certifications (e.g., life sustaining applications, automotive control, etc.).

Performing traceability on the modified elaborated model is highly advantageous. It enables active monitoring. For instance, if a change is made to the elaborated model, it can be determined immediately whether a customer intent has been changed, a safety rule has been violated, etc. The change can be identified and addressed during design rather than waiting until the end of the design stage, identifying issues during review, and then returning to the design phase. Quality is improved, time is saved, resources are conserved, and the product goes to market faster.

Figure 5:
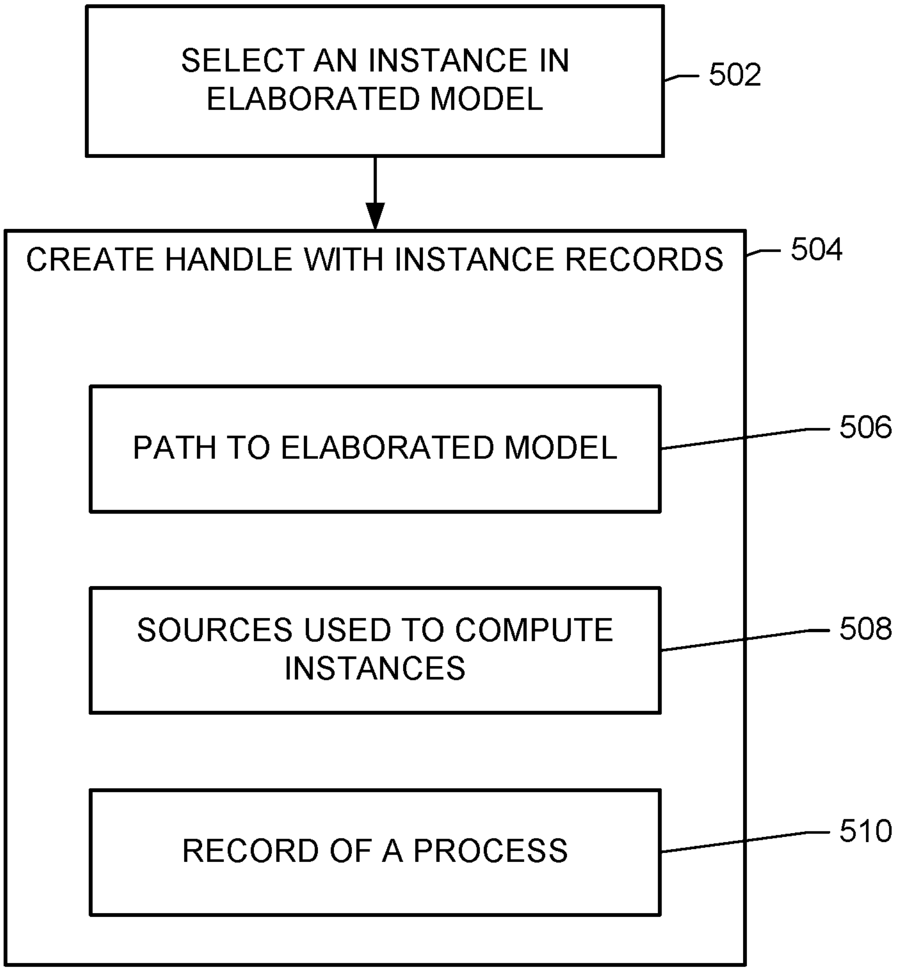
FIG. 5 shows a process for creating a handle of a unique identification in accordance with the various aspects and embodiments herein.

Referring now to FIG. 5, a process is shown for creating a handle for an instance in accordance with the various aspects and embodiments herein. At step 502, an instance in an elaborated model is selected.

At step 504, a handle is created using instance records. A record may be a combination of structural information, parametrization and process used to create the selected instance.

The records used to create a handle may include, without limitation, paths to the elaborated model (step 506), sources used to compute an instance in the elaborated model (step 508), and processes used to compute the instance (step 510). A handle may be based on one, two or all three of these records. Only one of the following steps 506 to 510 may be performed if a handle is based on one of these records, two of the following steps if based on two records, and all of the following steps if based on all three records.

At step 506, an example of the path to an elaborated component is the relative path from a root object of the top of a system level design. For example, the path to an instance of an inverter could be Itop/Icore/inv3.

At step 508, an example of a source includes parameters (e.g., size of memory IP) of the instance. Other examples include, but are not limited to, a power domain, a clock domain, size of a port, number of interfaces, clock speed, bandwidth of a component, component storage, IP configuration, and any parameter and/or attribute of a component.

At step 510, a record of a process may identify a process that is used to create the handle. A record of a process may also identify the order of one or more processes used to compute elaborated model instances.

According to one or more aspects and embodiments herein, a user may specify data to be used to create a handle. For example, the user may specify a version number. According to one or more aspects and embodiments herein, a record can contain information retrieved from a library.

Figure 6:
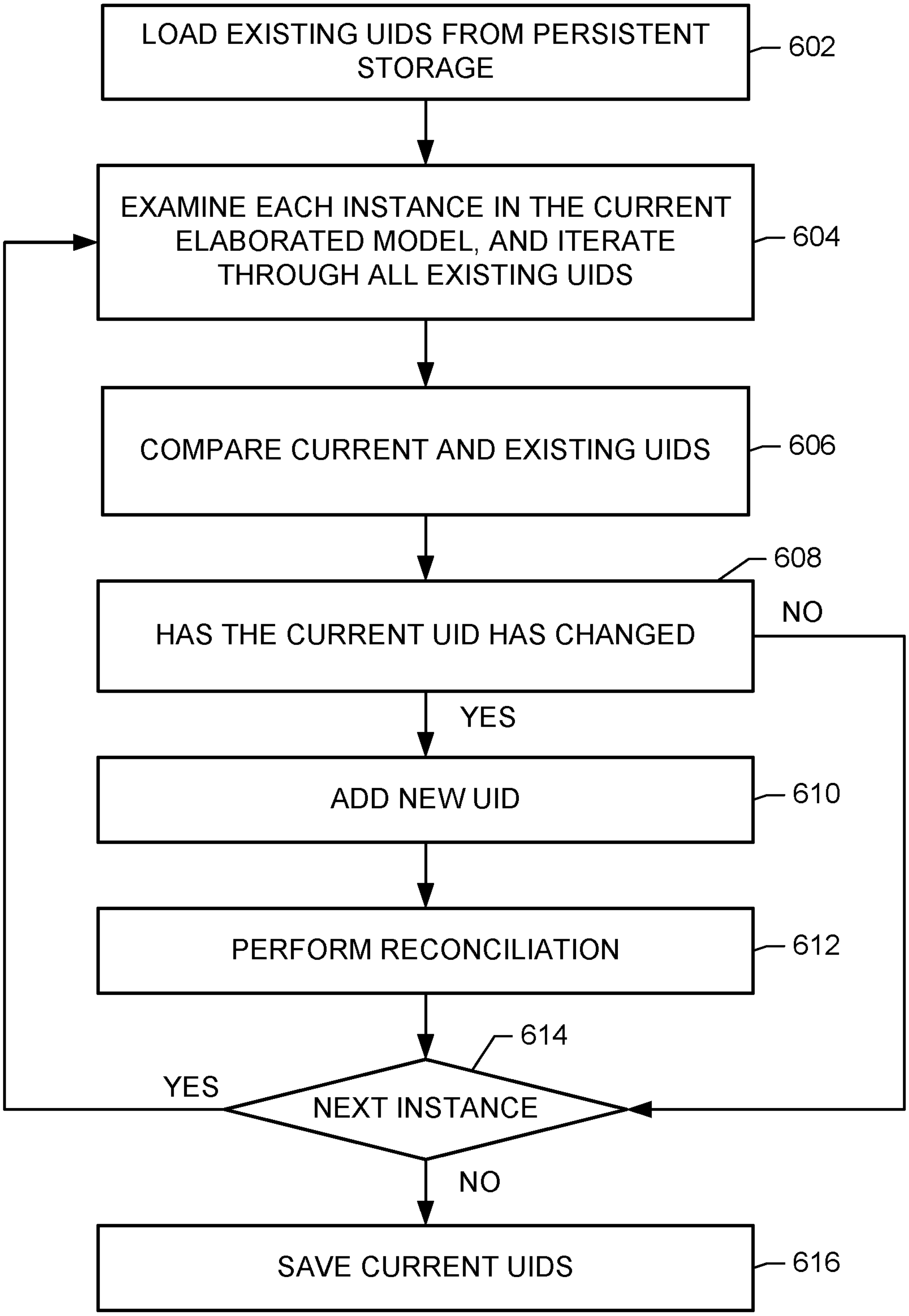
FIG. 6 shows a process for performing reconciliation when a change is made to an elaborated model in accordance with various aspects and embodiments herein.

Referring now to FIG. 6, a process includes performing reconciliation after a system level design change is made to the elaborated model in accordance with the various aspects and embodiments herein. At step 602, existing UIDs are loaded from persistent storage. At step 604, each instance in the current elaborated model is examined, and all existing UIDs are iterated through. At step 606, the current UID is computed and compared to the existing UID. According to one or more aspects and embodiments herein, when the current UID is not contained within the existing UID, a determination is made that the instance is new. If an existing UID does not correspond to an instance in the current elaborated model, a determination is made that the existing instance has been deleted from the elaborated model.

At step 608, a determination is made if the current UID has changed compared to the existing respective UID. The handle of each instance in the elaborated model is computed and compared to the existing handle. In some embodiments, this determination may be based on proximity alone. Proximity may be based on context proximity, that is, proximity relative to the surrounding instances. Proximity may instead be based on content proximity, that is, proximity of the current version of an instance to the previous version. For instance, a vector of the structure may be compared to a vector of the previous structure.

In some embodiments, this determination may be performed in two steps. A first function determines the proximity between the current handle and the handle of the existing UID. A second function uses the first function and heuristics to decide if a new handle is associated with the current handle unique key. According to one or more aspects and embodiments herein, a function is used to define if a new UID handle needs to be associated with a key.

In some embodiments, a change may be determined from other considerations. For example, a change may be based on modification flux and/or specific business knowledge.

Steps 610 and 612 are performed if a change has been made. At step 610, when an instance is determined to be new, a new UID is added for the new instance. At block 612, if the instance has been changed, reconciliation is performed.

According to one or more aspects and embodiments herein, steps 610 and 612 may be skipped if a change has not been made. The current UID may be discarded.

At step 614, a determination is made if the modified elaborated model has another instance to examine. If there is another instance, control is returned to step 604. If there is not another instance in the elaborated model, step 616 is performed.

At step 616, the current UIDs of modified and new instances are saved to persistent storage.

The lifecycle of a UID ends with destruction of the UID. In some cases, the UID cannot be preserved due to critical modifications of the elaborated model item. In some cases, the UID cannot be reconciled. Typical situations in which the UID cannot be reconciled include the following: the elaborated model item is no longer available; and the elaborated model item has changed beyond recognition. For example, in the case of port slice modification, tracing can be done at the slice level in ports but changing the size of the slice will require a new UID generation.

In some embodiments, manual reconciliation may be performed. For instance, the elaborated model is modified without a design tool and an instance is changed. The user may perform reconciliation of the modified instance.

According to one or more aspects and embodiments herein, a graphical user interface (GUI) may be used to manually remap a new instance to a previous UID. According to one or more aspects and embodiments herein, an indexation engine associates an elaborated model instance with the UID of the component or the UID of the parent of the component.

According to one or more aspects and embodiments herein, a profile may be used to aid the creation of UIDs and/or define which instances are tracked. For example, rules from a business profile may optimize the creation of UIDs and tracking of component instances. According to one or more aspects and embodiments herein, an IP vendor may use component tracking to determine that a licensee is using IP from the vendor according to the license between the IP vendor and the licensee.

Figure 7:
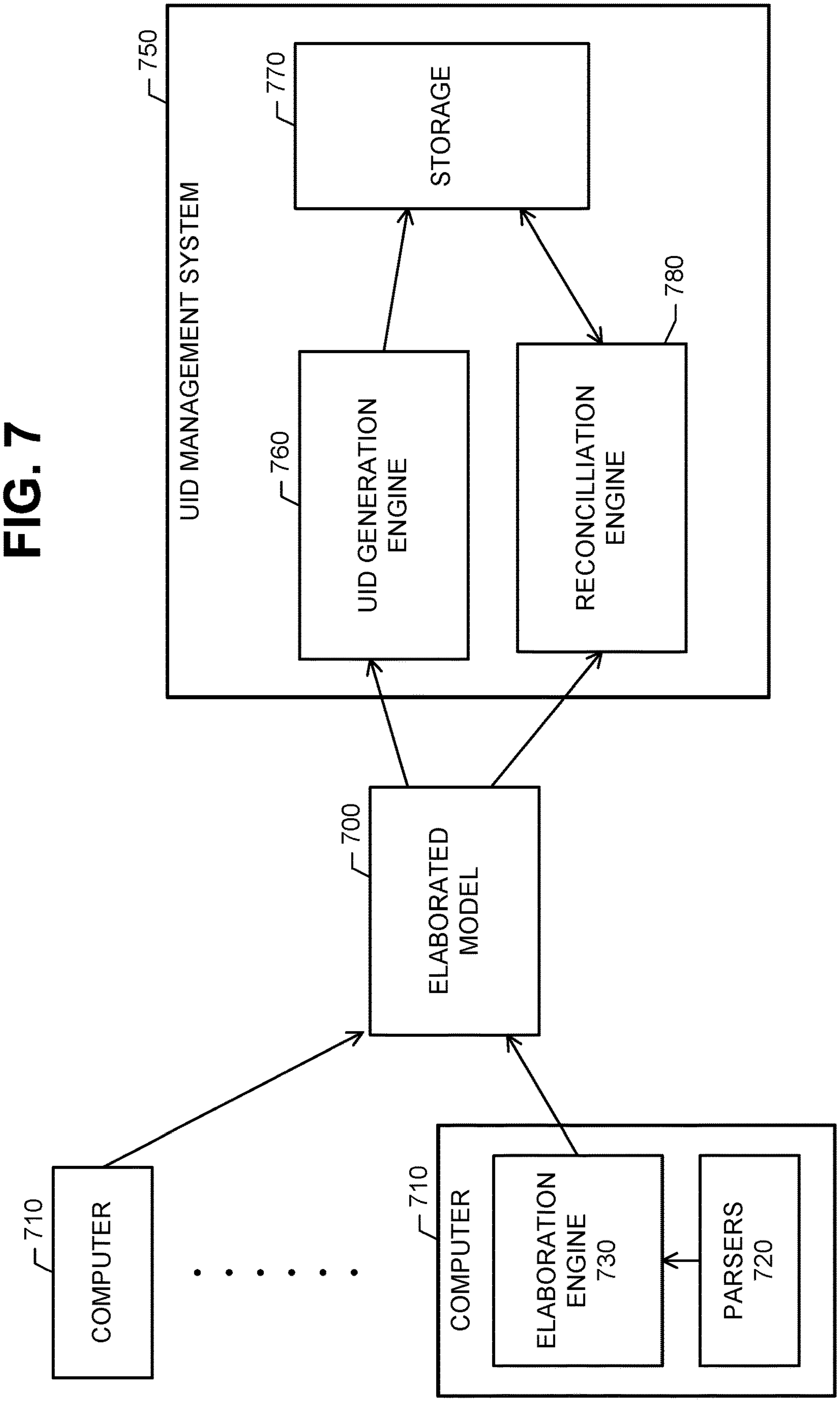
FIG. 7 shows a system for IC system design and system for unique identifier creation and management in accordance with various aspects and embodiments herein.

Reference is now made to FIG. 7, which shows a plurality of computers 710 and a UID management system 750. Each computer 710 includes parsers 720 for reading all required IEEE 1685 files, and an elaboration engine 730 for creating an elaborated model 700. The parsers 720 and the elaboration engine 730 may be part of an SoC assembly tool for electronic design automation. Each computer 710 may be used to modify the model 700.

According to one or more aspects and embodiments herein, the elaborated model 700 may be stored at a central location.

The UID management system 750 includes a UID generation engine 760 for creating UIDs for instances in the model 700. According to one or more aspects and embodiments herein, an instance is received from the elaborated model 700, and a UID is created or updated for the received instance. The UID generation engine 760 creates a unique key for each new instance. The UID generation engine 760 also creates a handle for each received instance. UIDs are stored in persistent storage 770.

The UID management system 750 further includes a reconciliation engine 780. The reconciliation engine 780 compares versions of current and existing UIDs and maintains and updates each UID in the persistent storage 770. The reconciliation engine 780 may suggest performing traceability on instances whose associated handles are not close.

According to one or more aspects and embodiments herein, the computers 710 do not communicate with the UID management system 750. The UIDs and their creation and management are transparent to the users of the computers 710. It is transparent in the sense that a user is not aware of it and need to be aware of it.

The UID management system 750 may be provided as a service. The service may be run by a third party.

According to one or more aspects and embodiments herein, the UID allows an instance to be tracked when the instance is deleted and then another instance is created elsewhere in the design.

Although the method above is described in connection with IEEE 1685 files, it is not so limited. Other files may be used. For instance, the files may be SystemVerilog files or Verilog files.

Certain examples have been described herein and it will be noted that different combinations of different components from different examples may be possible. Salient features are presented to better explain examples; however, it is clear that certain features may be added, modified and/or omitted without modifying the functional aspects of these examples as described.

Certain methods according to the various aspects of the invention may be performed by instructions that are stored upon a non-transitory computer readable medium. The non-transitory computer readable medium stores code including instructions that, if executed by one or more processors, would cause a system or computer to perform steps of the method described herein. The non-transitory computer readable medium includes: a rotating magnetic disk, a rotating optical disk, a flash random access memory (RAM) chip, and other mechanically moving or solid-state storage media. Any type of computer-readable medium is appropriate for storing code comprising instructions according to various example.

Various examples are methods that use the behavior of either or a combination of machines. Method examples are complete wherever in the world most constituent steps occur. For example, IP elements or units include: processors (e.g., CPUs or GPUs), random-access memory (RAM—e.g., off-chip dynamic RAM or DRAM), a network interface for wired or wireless connections such as ethernet, WiFi, 3G, 4G long-term evolution (LTE), 5G, and other wireless interface standard radios. The IP may also include various I/O interface devices, as needed for different peripheral devices such as touch screen sensors, geolocation receivers, microphones, speakers, Bluetooth peripherals, and USB devices, such as keyboards and mice, among others. By executing instructions stored in RAM devices processors perform steps of methods as described herein.

Some examples are one or more non-transitory computer readable media arranged to store such instructions for methods described herein. Whatever machine holds non-transitory computer readable media comprising any of the necessary code may implement an example. Some examples may be implemented as: physical devices such as semiconductor chips; hardware description language representations of the logical or functional behavior of such devices; and one or more non-transitory computer readable media arranged to store such hardware description language representations. Descriptions herein reciting principles, aspects, and embodiments encompass both structural and functional equivalents thereof. Elements described herein as coupled have an effectual relationship realizable by a direct connection or indirectly with one or more other intervening elements.

Practitioners skilled in the art will recognize many modifications and variations. The modifications and variations include any relevant combination of the disclosed features. Descriptions herein reciting principles, aspects, and embodiments encompass both structural and functional equivalents thereof. Elements described herein as "coupled" or "communicatively coupled" have an effectual relationship realizable by a direct connection or indirect connection, which uses one or more other intervening elements. Embodiments described herein as "communicating" or "in communication with" another device, module, or elements include any form of communication or link and include an effectual relationship. For example, a communication link may be established using a wired connection, wireless protocols, near-filed protocols, or RFID.

To the extent that the terms "including", "includes", "having", "has", "with", or variants thereof are used in either the detailed description and the claims, such terms are intended to be inclusive in a similar manner to the term "comprising."

The scope of the invention, therefore, is not intended to be limited to the exemplary embodiments shown and described herein. Rather, the scope and spirit of present invention is embodied by the appended claims.

What is claimed is:

1. A computer-implemented design method for an elaborated model of an integrated circuit, the method comprising:

creating unique identifications corresponding to at least some instances in the model, each unique identification including a unique key and a handle based on one or more properties of the corresponding instance;

storing the unique identifications in persistent storage;

modifying the model;

retrieving the stored unique identifications;

computing current handles for instances in the modified model; and performing reconciliation to determine whether the current handles are close to existing handles of in the retrieved unique identifications, wherein determining whether a handle is close includes determining proximity of the current handle to the existing handle, wherein determining whether the current and existing handles are close further includes using heuristics to decide if the current handle is associated with the unique key of the retrieved unique identification.

2. The method of claim 1, wherein the properties upon which the handles are based include at least one of paths to the elaborated model, sources used to compute the instances, and processes used to compute the instances.

3. The method of claim 1, further comprising modifying the model; retrieving the stored unique identifications; computing current handles for instances in the modified model; and performing reconciliation to determine whether the current handles are close to existing handles of in the retrieved unique identifications.

4. The method of claim 3, wherein determining whether a handle is close includes determining proximity of the current handle to the existing handle.

5. The method of claim 3, further comprising performing traceability on instances whose associated handles are not close.

6. A computer-implemented design method for an elaborated model of an integrated circuit, the method comprising:

creating unique identifications corresponding to at least some instances in the model, each unique identification including a unique key and a handle based on one or more properties of the corresponding instance;

storing the unique identifications in persistent storage;

modifying the model;

retrieving the stored unique identifications;

computing current handles for instances in the modified model; and performing reconciliation to determine whether the current handles are close to existing handles of in the retrieved unique identifications; and performing traceability on instances whose associated handles are not close, wherein the traceability includes determining whether system rules were violated; and providing immediate feedback of any rule violations.

7. The method of claim 6, wherein the one or more properties upon which the handle is based includes at least one of paths to a version of the elaborated model, sources used to compute the instances, and processes used to compute the instances.

8. The method of claim 6, wherein determining whether the handles in the current and existing identifications are close includes determining proximity of the current handle to the existing handle.

9. The method of claim 6, further comprising tracking each instance in a modified model whose handle is not close to the handle of a corresponding stored unique identifier and determining whether rules were violated.

10. A management system for different versions of an elaborated model of an integrated circuit, the system comprising:

an engine for creating unique identifications for at least some instances in the model, each identification including a unique key and a handle based on one or more properties of a corresponding instance; and a reconciliation engine for performing reconciliation on handles in current and existing identifications after a new version of the elaborated model has been created, the reconciliation performed to determine whether the handles in the current and existing identifications are close, wherein determining whether the handles in the current and existing identifications are close includes determining proximity of the current handle to the existing handle, wherein determining whether the handles are close further includes using heuristics.

* * * * *